(12) United States Patent
Kohiki (10) Patent No.: US 9,930,776 B2
(45) Date of Patent: Mar. 27, 2018

(54) ULTRATHIN COPPER FOIL AND METHOD OF MANUFACTURING THE SAME, AND ULTRATHIN COPPER LAYER

(71) Applicant: JX Nippon Mining & Metals Corporation, Tokyo (JP)

(72) Inventor: Michiya Kohiki, Hitachi (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 14/412,834

(22) PCT Filed: Dec. 25, 2012

(86) PCT No.: PCT/JP2012/083531
§ 371 (c)(1),
(2) Date: Jan. 5, 2015

(87) PCT Pub. No.: WO2014/006781
PCT Pub. Date: Jan. 9, 2014

(65) Prior Publication Data
US 2015/0195909 A1  Jul. 9, 2015

(30) Foreign Application Priority Data
Jul. 6, 2012  (JP) ................................. 2012-152823

(51) Int. Cl.
*B21C 37/00* (2006.01)
*H05K 1/09* (2006.01)
(Continued)

(52) U.S. Cl.
CPC ................. *H05K 1/09* (2013.01); *C25D 1/04* (2013.01); *C25D 1/22* (2013.01); *C25D 5/10* (2013.01);
(Continued)

(58) Field of Classification Search
None
See application file for complete search history.

(56) References Cited

U.S. PATENT DOCUMENTS 4,921,590 A * 5/1990 Khalid ..................... C25D 1/04
204/216
5,069,762 A 12/1991 Modrowski et al.
(Continued)

FOREIGN PATENT DOCUMENTS

CN  1993501 A   7/2007
EP  2615196 A1  7/2013
(Continued)

OTHER PUBLICATIONS

European Search Report dated Mar. 2, 2016 for European Application No. 12880617.
(Continued)

*Primary Examiner* — Seth Dumbris
(74) *Attorney, Agent, or Firm* — Drinker Biddle & Reath LLP (57) ABSTRACT

Provided is an ultrathin copper foil which has improved thickness accuracy of an ultrathin copper layer on a supporting copper foil. An ultrathin copper foil which is provided with a supporting copper foil, a releasing layer that is laminated on the supporting copper foil, and an ultrathin copper layer that is laminated on the releasing layer. The thickness accuracy of the ultrathin copper layer as determined by a weight thickness method is 3.0% or less.

24 Claims, 2 Drawing Sheets

(51) Int. Cl.
*C25D 1/22* (2006.01)
*C25D 5/10* (2006.01)
*C25D 7/06* (2006.01)
*C25D 5/12* (2006.01)
*C25D 1/04* (2006.01)
*H05K 3/02* (2006.01)
*C25D 3/38* (2006.01)
*C25D 3/12* (2006.01)

(52) U.S. Cl.
CPC ............. *C25D 5/12* (2013.01); *C25D 7/0614* (2013.01); *C25D 7/0621* (2013.01); *C25D 7/0635* (2013.01); *C25D 3/12* (2013.01); *C25D 3/38* (2013.01); *H05K 3/025* (2013.01); *H05K 2201/0355* (2013.01); *H05K 2203/1545* (2013.01); *Y10T 428/12438* (2015.01); *Y10T 428/24917* (2015.01)

(56) References Cited

U.S. PATENT DOCUMENTS

| | | | |
|---|---|---|---|
| 5,164,059 A | 11/1992 | Geiermann et al. | |
| 5,326,455 A * | 7/1994 | Kubo | C25D 1/04 204/211 |
| 6,051,118 A | 4/2000 | Asaki et al. | |
| 6,270,889 B1 * | 8/2001 | Kataoka | C25D 1/22 156/289 |
| 6,541,126 B1 * | 4/2003 | Yoshioka | C25D 1/04 428/201 |
| 7,771,841 B2 * | 8/2010 | Suzuki | C25D 1/04 428/661 |
| 7,816,015 B2 | 10/2010 | Sato | |
| 2003/0102209 A1 * | 6/2003 | Hosokoshi | C25D 1/04 204/199 |
| 2011/0209903 A1 | 9/2011 | Uno et al. | |

FOREIGN PATENT DOCUMENTS

| | | |
|---|---|---|
| JP | 61-087889 A | 5/1986 |
| JP | 04-341596 A | 11/1992 |
| JP | 08-209396 A | 8/1996 |
| JP | 2000-309898 A | 11/2000 |
| JP | 2003-033994 A | 2/2003 |
| JP | 2004-035985 A | 2/2004 |
| JP | 2004-131821 A | 4/2004 |
| JP | 2005-008973 A | 1/2005 |
| JP | 2008-013847 A | 1/2008 |
| KR | 1020110049920 A | 5/2011 |
| WO | WO2012046804 A1 | 4/2012 |
| WO | WO-2012/132573 A1 | 10/2012 |

OTHER PUBLICATIONS

International Search Report dated Mar. 1, 2013 (PCT/JP2012/083531).

* cited by examiner

ULTRATHIN COPPER FOIL AND METHOD OF MANUFACTURING THE SAME, AND ULTRATHIN COPPER LAYER

TECHNICAL FIELD

The present invention relates to an ultrathin copper foil and a method of manufacturing the same, and an ultrathin copper layer. In further detail, the present invention relates to an ultrathin copper foil used as a material of a printed circuit board for fine pattern applications and to a method of manufacturing the same, and to an ultrathin copper layer.

BACKGROUND ART

In recent years, fine-line circuitry is demanded in a printed circuit board as the density of semiconductor integrated circuits is increased. A common method of producing fine-line circuitry is the modified semi-additive process (MSAP) of which circuits are formed on an ultrathin copper layer, followed by removing the ultrathin copper layer through an etch process with a sulfuric acid/hydrogen peroxide type etchant. Therefore, the ultrathin copper layer is preferably uniform in thickness.

Figure 1:
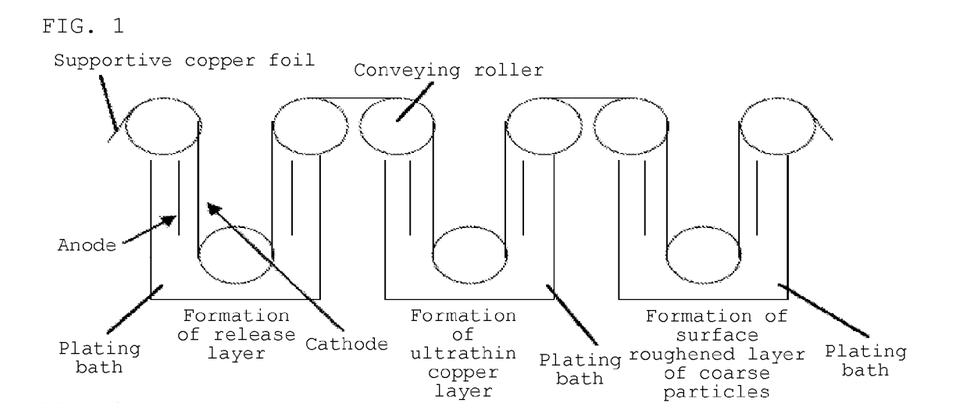
FIG. 1 is a schematic diagram of illustrating the conventional conveying system for a copper foil in the form of a zigzag path.

Herein, accuracy of the thickness of the electroplated copper foil strongly depends on the interelectrode distance between anode and cathode. A common method of forming an ultrathin copper layer involves formation of a release layer on a supportive copper foil (12 to 70 µm thick), on the surface of which an ultrathin copper foil layer (0.5 to 10.0 µm thick) and coarse particles by surface roughening are then formed. In the past the step after formation of the supportive copper foil uses the conveying system for the supportive copper foil in the form of zigzag path without a drum to support it as illustrated in FIG. 1. (Patent Literature 1)

CITATION LIST

Patent Literature

Patent Literature 1: JP 2000-309898 A

SUMMARY OF INVENTION

Technical Problem

However, since accuracy of the thickness of the ultrathin copper layer formed by electrolytic plating strongly depends on the interelectrode distance between anode and cathode, use of such a conveying system for a supportive copper foil as the form of zigzag path without a drum to support the supportive copper foil makes it difficult to keep the interelectrode distance constant because of effects such as the electrolyte and tension for conveying the supportive copper foil, causing the problem of larger variations in thickness.

The purpose of the present invention is to provide an ultrathin copper foil in which accuracy of the thickness of the ultrathin copper layer on a supportive copper foil is improved.

Solution to Problem

To realize the purpose described above the present inventors performed extensive investigation and found that in focusing on the steps after formation of a supportive copper foil, accuracy of the thickness of an ultrathin copper layer can be improved by keeping the interelectrode distance constant using a drum instead of a zigzag path as a support medium for conveying the ultrathin copper foil.

The present invention is completed based on the findings described above, and in one aspect, the invention relates to an ultrathin copper foil comprising a supportive copper foil, a release layer superposed on the supportive copper foil, and an ultrathin copper layer superposed on the release layer, and it relates to the ultrathin copper foil with accuracy of the thickness of the ultrathin copper layer to be 3.0% or less when measured with the weight method.

In another aspect the present invention relates to an ultrathin copper foil comprising a supportive copper foil, a release layer superposed on the supportive copper foil, and an ultrathin copper layer superposed on the release layer, and it relates to the ultrathin copper foil with accuracy of the thickness of the ultrathin copper layer to be 10.0% or less when measured with the four-point probe method.

In one embodiment of an ultrathin copper foil related to the present invention there is the surface roughened layer of coarse particles on the surface of the ultrathin copper layer.

Further in another aspect of the present invention it relates to a method of manufacturing an ultrathin copper foil comprising a supportive copper foil, a release layer superposed on the supportive copper foil, and an ultrathin copper layer superposed on the release layer by treating the surface of the belt-like shaped supportive copper foil conveyed by the roll-to-roll conveyance process in the length direction, and to a manufacture method of the ultrathin copper foil including a step of forming a release layer on the surface of the supportive copper foil conveyed by a conveying roller and a step of forming an ultrathin copper layer on the surface of the release layer by electrolytic plating while supporting with a drum the supportive copper foil on which the release layer is formed and which is conveyed by a conveying roller.

In one embodiment of a manufacture method of an ultrathin copper foil in the present invention a step of forming the release layer involves formation of an ultrathin copper layer on the surface of the supportive copper foil by electrolytic plating while supporting with a drum the supportive copper foil conveyed by a conveying roller.

In another embodiment a manufacture method of an ultrathin copper foil in the present invention further includes a step of forming a surface roughened layer of coarse particles on the surface of an ultrathin copper layer of the supportive copper foil conveyed with a conveying roller.

In another embodiment of a manufacture method of an ultrathin copper foil in the present invention a step of forming the surface roughened layer of coarse particles further includes formation of the surface roughened layer of coarse particles on the surface of the ultrathin copper layer by electrolytic plating while supporting with a drum the supportive copper foil conveyed with a conveying roller.

In another aspect of the present invention it further relates to an ultrathin copper layer of an electrolytic copper foil superposed on a release layer which is superposed on a supportive copper foil, constituting the ultrathin copper foil together with the supportive copper foil and the release layer and to the ultrathin copper layer with accuracy of the thickness to be 3.0% or less when measured with the weight method.

In another aspect of the present invention it further relates to an ultrathin copper layer of an electrolytic copper foil superposed on a release layer which is superposed on a supportive copper foil, constituting the ultrathin copper foil together with the supportive copper foil and the release layer and to the ultrathin copper layer with accuracy of the thickness to be 10.0% or less when measured with the four-point probe method.

In one embodiment an ultrathin copper layer of the present invention is the ultrathin copper layer of electrolytic copper foil superposed on a release layer which is superposed on the supportive copper foil, constituting the ultrathin copper foil together with the supportive copper foil and the release layer, and having a surface roughened layer of coarse particles on the surface of the ultrathin copper layer.

In another aspect of the present invention it further relates to a printed circuit board manufactured using the ultrathin copper foil of the present invention.

In another aspect of the present invention it further relates to a printed circuit board using the ultrathin copper layer of the present invention.

Advantageous Effects of Invention

According to the present invention an ultrathin copper foil can be provided, of which accuracy of the thickness of an ultrathin copper layer on a supportive copper foil is improved.

DESCRIPTION OF EMBODIMENTS

1. Supportive Copper Foil

A supportive copper foil usable in the present invention is typically provided in the form of a rolled copper foil and an electrolytic copper foil. Generally an electrolytic copper foil is manufactured by electrolytic plating of copper sulfate in a plating bath to deposit on a titanium or stainless steel drum, whereas a rolled copper foil is manufactured by repeating the plastic deformation and heat treatment of the foil material with a press roll. Materials for a copper foil used can include, in addition to high purity copper such as tough pitch copper and oxygen-free copper, for example, Sn-added copper, Ag-added copper, and a copper alloy such as a Cr-, Zr- or Mg-added copper alloy, and a Corson-type copper alloy in which Ni and Si are added. When the term "copper foil" is used independently in the present description, a copper alloy foil is included.

The thickness of a supporting copper foil usable in the present invention is not particularly limited, and the thickness may be appropriately chosen to properly serve its function as a supportive copper foil, and for example, the thickness can be 12 µm or more. However, in general the thickness is preferably 35 µm or less since production cost becomes higher when too thick. Therefore, the thickness of a supportive copper foil is typically from 12 to 70 µm, more typically from 18 to 35 µm.

2. Release Layer

A release layer is provided on a supportive copper foil. The release layer can be formed using nickel, nickel-phosphorous alloy, nickel-cobalt alloy, chromium, and the like. The release layer is the part released when the supportive copper foil is peeled from the ultrathin copper layer, and can have the effects of a barrier to prevent copper in the supportive copper foil from diffusing into the ultrathin copper layer.

When an electrolytic copper foil is used as the supportive copper foil, a release layer is preferably provided on the low-roughness surface from the viewpoint of reducing pinholes. The release layer can be provided using processes such as plating, sputtering, chemical vapor deposition (CVD), and physical vapor deposition.

3. Ultrathin Copper Layer

An ultrathin copper layer is provided on a release layer. The ultrathin copper layer can be formed by electrolytic plating using a plating bath of copper sulfate, copper pyrophosphate, copper sulfamate, and copper cyanide, and a copper sulfate bath is preferred since it is used for production of an electrolytic copper foil and the copper foil can be formed with high current density. The thickness of the ultrathin copper layer is not particularly limited, and generally thinner than the supportive copper foil, for example, 12 µm or less. Typically the thickness is from 0.5 to 10 µm, more typically from 1 to 5 µm.

4. Surface Roughening Treatment

A surface roughened layer of coarse particles can be provided on the surface of an ultrathin copper layer by surface roughening treatment, for example, in order to improve adhesion to an insulating substrate. Surface roughening can be performed, for example, by forming coarse particles of copper or copper alloy. Surface roughening may form fine particles. The surface roughened layer may be the layer including either elemental substance selected from a group consisted of copper, nickel, cobalt, and zinc or an alloy containing one or more of any one of the elements in the group. Or after surface roughening treatment or without surface roughening treatment secondary particles and tertiary particles of the elemental substance or alloy of nickel, cobalt, copper, and zinc and/or an anticorrosion layer are formed and then the surface treatment such as the chromate treatment and the silane coupling treatment is performed. That is, one type or more of layers selected from the group consisted of the anticorrosion layer, the chromate treatment layer, and the silane coupling treatment layer may be formed on the surface of the surface roughened layer of coarse particles or one type or more of layers selected from the group consisted of the anticorrosion layer, the chromate treatment layer, and the silane coupling treatment layer may be formed on the surface of the ultrathin copper layer.

5. Ultrathin Copper Foil

An ultrathin copper foil is comprising a supportive copper foil, a release layer formed on the supportive copper foil, and an ultrathin copper layer superposed on the release layer. The way to use the ultrathin copper foil itself is well known to those skilled in the art, and for example, the surface of the ultrathin copper layer is laminated to an insulating substrate such as phenol resin impregnated paper base, epoxy resin impregnated paper base, epoxy resin impregnated synthetic fabric base, epoxy resin impregnated composite base of fiberglass and paper, epoxy resin impregnated composite base of fiberglass fabric and fiberglass nonwoven fabric, epoxy resin impregnated fiberglass fabric base, a polyester film, and a polyimide film and heat-pressed, followed by peeling the carrier and etching the ultrathin copper layer adhered to the insulating substrate to form a targeted conductor pattern, thereby manufacturing a printed circuit board. In the ultrathin copper foil related to the present invention, release site is mainly at the interface between the release layer and the ultrathin copper layer.

6. Manufacture Method of an Ultrathin Copper Foil

Figure 2:
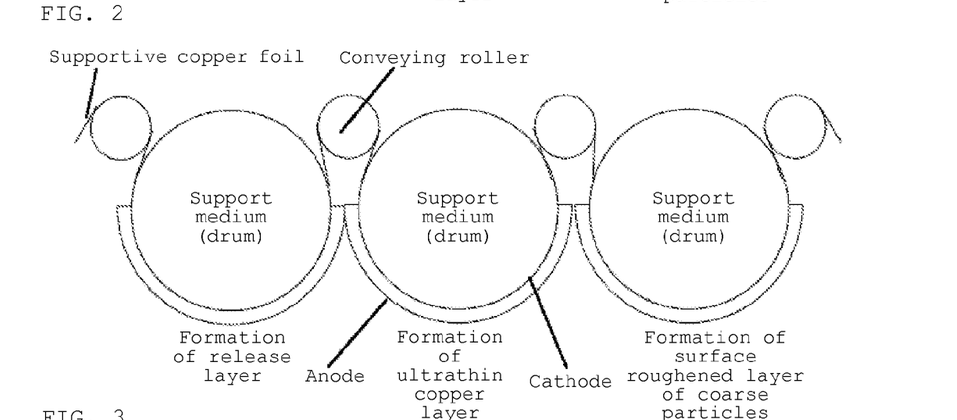
FIG. 2 is a schematic diagram of illustrating the conveying system for a copper foil related to a manufacture method of an ultrathin copper foil related to embodiment 1 of the present invention.

A manufacture method of an ultrathin copper foil related to the present invention will next be described. FIG. 2 is a schematic diagram of illustrating the conveying system for a copper foil related to a manufacture method of the ultrathin copper foil related to embodiment 1 of the present invention. The manufacture method of the ultrathin copper foil related to embodiment 1 of the present invention is a method of manufacturing the ultrathin copper foil comprising a supportive copper foil, a release layer superposed on the supportive copper foil, and an ultrathin copper layer superposed on the release layer by treating the surface of the belt-like shaped supportive copper foil conveyed by the roll-to-roll conveyance process in the length direction. A manufacture method of the ultrathin copper foil related to embodiment 1 of the present invention includes a step of forming by electrolytic plating an ultrathin copper layer on the surface of the supportive copper foil while supporting with a drum the supportive copper foil conveyed by a conveying roller, a step of forming by electrolytic plating the ultrathin copper layer on the surface of the release layer while supporting with a drum the supportive copper foil on which the release layer is formed, and a step of forming by electrolytic plating the surface roughened layer of coarse particles on the surface of the ultrathin copper layer while supporting the supportive copper foil with a drum. In each step the treatment surface of the supportive copper foil supported with the drum simultaneously serves as cathode, and electrolytic plating process in each step proceeds in the copper plating solution between the drum and the anode placed opposite to the drum.

In the present invention the supportive copper foil is conveyed while applying tension to the supportive copper foil in the length direction, since the belt-like shaped supportive copper foil is conveyed by the roll-to-roll conveyance process. Tension can be adjusted by applying the torque created by connecting each conveying roller to a drive motor. Tension of conveying the supportive copper foil is preferably from 0.01 to 0.2 kg/mm. When tension for conveying the supportive copper foil is below 0.01 kg/mm, the contact force to the drum is too weak, making it difficult to adjust the thickness of each layer to the desired thickness. Also problems such as slipping are likely to occur depending on the structure of equipment and a supportive copper foil roll further slacks, thereby likely to cause problems such as the winding slippage. On one hand, when tension for conveying the supportive copper foil exceeds 0.2 kg/mm, slight misalignment of the supportive copper foil is likely to create creases and folds so that it is not preferred from the viewpoint of managing equipment. When a roll is wound too hard, tight winding is likely to cause wrinkles. Tension for conveying the supportive copper foil is more preferably from 0.02 to 0.1 kg/mm.

Figure 3:
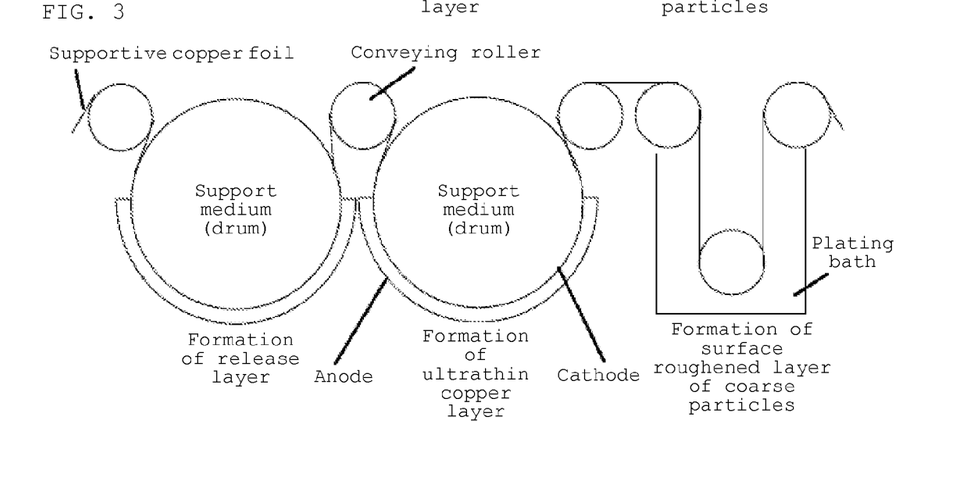
FIG. 3 is a schematic diagram of illustrating the conveying system for a copper foil related to a manufacture method of an ultrathin copper foil related to embodiment 2 of the present invention.
Figure 4:
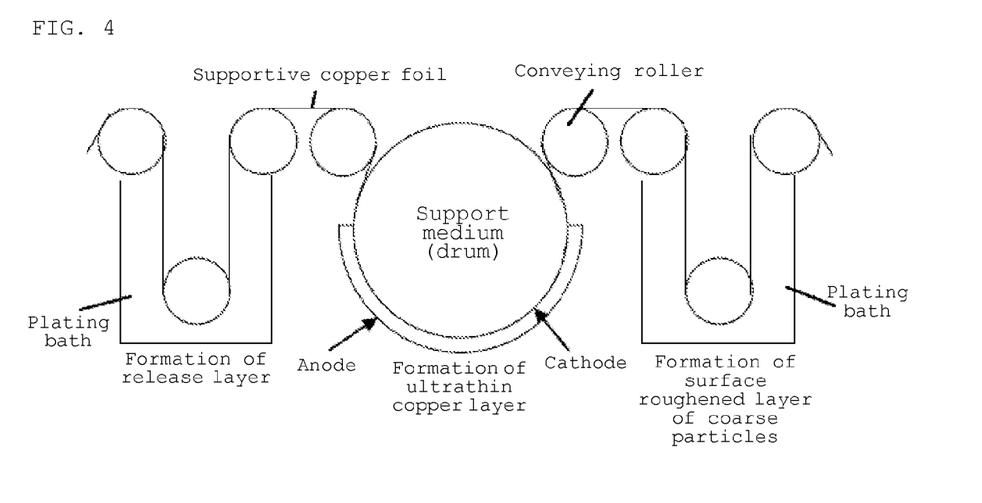
FIG. 4 is a schematic diagram of illustrating the conveying system for a copper foil related to a manufacture method of an ultrathin copper foil related to embodiment 3 of the present invention.

In embodiment 1 both the release layer and the surface roughened layer are formed by electrolytic plating while supporting the supportive copper foil with a drum, but the invention is not limited by that embodiment. For example, as illustrated in FIG. 3 as embodiment 2, a surface roughened layer of coarse particles may be formed by electrolytic plating using the conventional conveying system for the copper foil in the form of the zigzag path without supporting the supporting copper foil with a drum. As illustrated in FIG. 4 as embodiment 3, both the release layer and the surface roughened layer of coarse particles may also be formed by electrolytic plating using the conventional conveying system for the copper foil in the form of zigzag path without supporting the supporting copper foil with a drum. However, since in embodiments 2 and 3 the drum for the conveying system of the supportive copper foil is not used in every step as in embodiment 1, it is difficult to make constant the interelectrode distance in electrolytic plating as compared to embodiment 1, resulting in lower accuracy in controlling the thickness of the release layer and/or the surface roughened layer of coarse particles.

As described above, the present invention keeps constant the interelectrode distance between anode and cathode in electrolytic plating by supporting a supportive copper foil with a drum. Therefore, variations in the thickness of the copper foil layer formed are prevented enabling preparation of an ultrathin copper foil with an ultrathin copper layer having the thickness in high accuracy.

The ultrathin copper foil thus prepared has high accuracy in the thickness of the ultrathin copper layer measured with the weight method to be 3.0% or less, preferably 2.0% or less resulting in the highly accurate thickness. The lower limit of accuracy is not required to set in particular, and for example, 0.05% or more, or 0.1% or more, or 0.2% or more.

A measurement method for determining accuracy of the thickness by the weight method will be herein described. Firstly the total weight of a supportive copper foil and an ultrathin copper foil is measured and then an ultrathin copper layer is peeled off to reweigh the supportive copper foil to assign the weight difference between the former and the latter as the weight of the ultrathin copper layer. A sample piece of an ultrathin copper layer is obtained as the measuring object by punching out the ultrathin copper foil into a 3 cm×3 cm sheet with the press. To study accuracy of the thickness determined from the weight, the thickness of the ultrathin copper layer in each standard is determined by the weight method at 10 points at equal space in the width direction and 6 points (spacing of 4 cm) in the length direction, a total of 60 points to calculate the mean and the standard deviation ($\sigma$). The formula for calculating accuracy of the thickness is given as follows.

$$\text{Accuracy in thickness (\%)}=3\sigma\times100/\text{mean}$$

Repeat accuracy of the measurement method is 0.2%.

An ultrathin copper foil thus prepared has accuracy of the thickness of the ultrathin copper layer determined by the four-point probe method to be 10.0% or less, preferably 6.0% or less, resulting in the highly accurate thickness. The lower limit of accuracy is not required to set in particular, and for example, 0.05% or more, or 0.5% or more, or 0.7% or more, or 1.0% or more.

A measurement method for determining accuracy of the thickness with the four-point probe method will be herein described. The total thickness of the supportive copper foil and the ultrathin copper foil is determined by measuring the resistivity with the four-point probe and then the ultrathin copper layer is peeled off to redetermine the resistivity of the supportive copper foil for determining its thickness to assign the difference between the former and the latter as the thickness of the ultrathin copper layer. To study accuracy of the thickness, the thickness of the ultrathin copper layer in each standard is determined at a spacing of 5 mm in the width direction to calculate the mean and the standard deviation (σ) at total of 280 measuring points. The formula for calculating accuracy of the thickness with the four point probe is given as follows.

Accuracy in thickness (%)=3σ×100/mean

Repeat accuracy of the measurement method is 1.0%.

Examples

Hereinafter, the present invention will be described in further detail below in accordance with the examples, but is in no way limited by the examples.

1. Manufacture of Ultrathin Copper Foil

Belt-like shaped supportive copper foils with the thickness described in Table were prepared as the supportive copper foil. Electrolytic copper foils of JTC (manufactured by JX Nippon Mining & Metals Corporation) were used as the copper foil in Examples 1, 3, 5-7, 10, 13, 15, and 16 and Comparative Examples 1 and 2, whereas rolled copper foils of tough pitch copper JIS H3100 C1100 (manufactured by JX Nippon Mining & Metals Corporation) were used as the copper foil in Examples 2, 4, 8, 9, 11, 12, and 14 and Comparative Example 3. On the shiny surface of the copper foil were formed the release layer, the ultrathin copper layer, and the surface roughened layer of coarse particles under the condition described in Table 1 using the continuous roll-to-roll fabrication line. Herein, copper foils in Examples 1-3 were prepared in accordance with the system related to embodiment 3 illustrated in FIG. 4 described above, those in Examples 4-9 were prepared in accordance with embodiment 2 illustrated in FIG. 3 described above, and those in Examples 10-16 were prepared in accordance with embodiment 1 illustrated in FIG. 2 described above. Copper foils in Comparative Examples 1-3 were prepared in accordance with the conventional system illustrated in FIG. 1 described above.

Preparation of Release Layer
(A) Conveying System for Copper Foil in Accordance with Zigzag Path
　Anode: insoluble electrode
　Cathode: treated surface of supportive copper foil
　Interelectrode distance (indicated in Table 1)
　Composition of electrolytic plating solution: $NiSO_4$ 100 g/L
　pH of electrolytic plating solution: 6.7
　Temperature of electrolytic plating bath: 40° C.
　Current density for electrolytic plating: 5 A/dm$^2$
　Electrolytic plating time: 10 seconds
　Tension in conveying a supportive copper foil: 0.05 kg/mm
(B) Conveying System of Copper Foil with Drums
　Anode: insoluble electrode
　Cathode: surface of a supportive copper foil supported with a drum of 100 cm diameter.
　Interelectrode distance (indicated in Table 1)
　Composition of electrolytic plating solution: $NiSO_4$ 100 g/L
　pH of electrolytic plating solution: 6.7
　Temperature of electrolytic plating bath: 40° C.
　Current density for electrolytic plating: 5 A/dm$^2$
　Electrolytic plating time: 10 seconds
　Tension in conveying a supportive copper foil: 0.05 kg/mm Preparation of Ultrathin Copper Layer
(A) Conveying System for Copper Foil in Accordance with Zigzag Path
　Anode: insoluble electrode
　Cathode: treated surface of a supportive copper foil
　Interelectrode distance (indicated in Table 1)
　Composition of electrolytic plating solution: Cu: 50 g/L, $H_2SO_4$: 50 g/L, and Cl: 60 ppm
　Temperature of electrolytic plating bath: 45° C.
　Current density for electrolytic plating: 30 A/dm$^2$
　Tension in conveying a supportive copper foil: 0.05 kg/mm
(B) Conveying System of Copper Foil with Drums
　Anode: insoluble electrode
　Cathode: surface of a supportive copper foil supported with a drum of 100 cm diameter
　Interelectrode distance (indicated in Table 1)
　Composition of electrolytic plating solution: Cu: 100 g/L, $H_2SO_4$: 80 g/L, and Cl: 60 ppm
　Temperature of electrolytic plating bath: 55° C.
　Current density for electrolytic plating: 30 A/dm$^2$
　Tension in conveying a supportive copper foil: 0.05 kg/mm Preparation of Surface Roughened Layer of Coarse Particles
(A) Conveying System for Copper Foil in Accordance with Zigzag Path
　Anode: insoluble electrode
　Cathode: treated surface of supportive copper foil
　Interelectrode distance (indicated in Table 1)
　Composition of electrolytic plating solution: Cu: 10 g/L and $H_2SO_4$: 50 g/L
　Temperature of electrolytic plating bath: 40° C.
　Current density for electrolytic plating: 30 A/dm$^2$
　Tension in conveying a supportive copper foil: 0.05 kg/mm
(B) Conveying System of Copper Foil with a Drum
　Anode: insoluble electrode
　Cathode: surface of supportive copper foil supported with a drum of 100 cm diameter
　Interelectrode distance (indicated in Table 1)
　Composition of electrolytic plating solution: Cu: 20 g/L and $H_2SO_4$: 50 g/L
　Temperature of electrolytic plating bath: 40° C.
　Current density for electrolytic plating: 30 A/dm$^2$
　Tension in conveying a supportive copper foil: 0.05 kg/mm 2. Evaluation of Ultrathin Copper Foil Accuracy of the thickness of ultrathin copper foils obtained as described above was evaluated using the following method. Results are shown in Table 1.

Evaluation of Accuracy of the Thickness Determined by the Weight Method

Firstly the total weight of a supportive copper foil and an ultrathin copper foil is measured and then an ultrathin copper layer is peeled off to reweigh the supportive copper foil to assign the weight difference between the former and the latter as the weight of the ultrathin copper layer. The ultrathin copper foil was punched out into a 3 cm.×3 cm sheet with the press yielding a sample piece for determining the weight of an ultrathin copper layer. To study accuracy of the thickness determined from the weight, the thickness of the ultrathin copper layer in each standard is determined by the weight method at 10 points with equal space in the width direction and 6 points (spacing of 4 cm) in the length direction, a total of 60 points to calculate the mean and the standard deviation (σ). The formula for calculating accuracy of the thickness is given as follows.

Accuracy in thickness (%)=3σ=100/mean

Repeat accuracy of the measurement method is 0.2%.

A balance HF-400 (manufacture by A & D Company, Ltd.) was used as a balance and a press HAP-12 (manufactured by NOGUCHI PRESS Co., Ltd.) was used as the press.
Evaluation of Accuracy of the Thickness Determined by the Four-Point Probe Method The thickness of the supportive copper foil and the ultrathin copper foil is determined by measuring the resistivity with the four-point probe and then the ultrathin copper layer is peeled off to remeasure the resistivity of the supportive copper foil for determining its thickness to assign the difference between the former and the latter as the thickness of the ultrathin copper layer. To study accuracy of the thickness, the thickness of the ultrathin copper layer in each standard is determined at a spacing of 5 mm in the width direction, a total of 280 measuring points to calculate the mean and the standard deviation (σ). The formula for calculating accuracy of the thickness determined by measuring the resistivity with the four point probe is given as follows.

Accuracy in thickness (%)=3σ×100/mean

Repeat accuracy of the measurement method is 1.0%.

A four point probe CMI-700 (manufactured by Oxford Instruments PLC) was used as the four point probe.

10% in every one by the four-point probe method, indicating large variation in the thickness.

The invention claimed is:

1. An ultrathin copper foil comprising a supportive copper foil, a release layer superposed on the supportive copper foil, and an ultrathin copper layer superposed on the release layer, wherein the thickness of the ultrathin copper layer is 12 μm or less;

the accuracy of the thickness of the ultrathin copper layer is 3.0% or less, determined by a weight method comprising:

punching out from the ultrathin copper foil sixty 3 cm×3 cm samples, which samples are obtained by punching the ultrathin copper foil in a pattern determined by 6 rows of 10 equally spaced punch locations where the rows extend in the width direction of the ultrathin copper foil and adjacent rows are separated by a distance of 4 cm, for each of the sixty samples:

measuring the total weight of the ultrathin copper layer and the supportive copper foil layer in the sample;

peeling away the ultrathin copper layer from the supportive copper foil layer in the sample;

weighing the supportive copper foil layer thus separated from the ultrathin copper layer in the sample,

TABLE 1

| | | Release layer | | Ultrathin layer (mm) | | Surface roughened layer of coarse particles | | Accuracy of thickness (%) | |
|---|---|---|---|---|---|---|---|---|---|
| | Foil thickness (μm) | Conveying system | Inter-electrode distance (mm) | Conveying system | Inter-electrode distance (mm) | Conveying system | Inter-electrode distance (mm) | Weight method | Four-point probe method |
| Example 1 | 3 | zigzag | 50 | drum | 8 | zigzag | 50 | 2.55 | 9.18 |
| Example 2 | 5 | zigzag | 50 | drum | 8 | zigzag | 50 | 1.58 | 8.32 |
| Example 3 | 2 | zigzag | 50 | drum | 8 | zigzag | 50 | 2.86 | 9.68 |
| Example 4 | 3 | drum | 8 | drum | 8 | zigzag | 50 | 2.45 | 8.89 |
| Example 5 | 5 | drum | 8 | drum | 8 | zigzag | 50 | 1.45 | 8.12 |
| Example 6 | 2 | drum | 8 | drum | 8 | zigzag | 50 | 2.65 | 9.63 |
| Example 7 | 3 | drum | 8 | drum | 8 | zigzag | 50 | 2.45 | 8.89 |
| Example 8 | 5 | drum | 8 | drum | 8 | zigzag | 50 | 1.45 | 8.12 |
| Example 9 | 2 | drum | 8 | drum | 8 | zigzag | 50 | 2.54 | 9.32 |
| Example 10 | 3 | drum | 8 | drum | 8 | drum | 8 | 1.56 | 6.54 |
| Example 11 | 5 | drum | 8 | drum | 8 | drum | 8 | 1.04 | 5.63 |
| Example 12 | 2 | drum | 8 | drum | 8 | drum | 8 | 1.89 | 7.04 |
| Example 13 | 5 | drum | 5 | drum | 5 | drum | 5 | 0.50 | 2.67 |
| Example 14 | 2 | drum | 5 | drum | 5 | drum | 5 | 0.81 | 4.03 |
| Example 15 | 3 | drum | 5 | drum | 5 | drum | 5 | 0.72 | 3.31 |
| Example 16 | 12 | drum | 5 | drum | 5 | drum | 5 | 0.31 | 1.02 |
| Comparative Example 1 | 3 | zigzag | 50 | zigzag | 50 | zigzag | 50 | 4.56 | 15.36 |
| Comparative Example 2 | 5 | zigzag | 50 | zigzag | 50 | zigzag | 50 | 3.12 | 12.11 |
| Comparative Example 3 | 2 | zigzag | 50 | zigzag | 50 | zigzag | 50 | 4.89 | 16.22 |

Results of Evaluation

In Examples 1-16 accuracy of the thickness of the ultrathin copper layer is 3% or less in every one by the weight method and 10% or less in every one by the four-point probe method, indicating variation of the thickness is effectively prevented.

In Comparative Examples 1-3 accuracy of the thickness exceeds 3% in every one by the weight method and exceeds and determining the weight of the ultrathin copper layer in the sample by subtracting the weight of the supportive copper foil layer from the total weight of the ultrathin copper layer and the supportive copper foil layer;

calculating the accuracy of thickness of the ultrathin copper layer by the equation:

Accuracy in thickness (%)=3σ×100/mean wherein σ is the standard deviation and "mean" is the mean deviation of the weights of the ultrathin copper layer in the samples.

2. An ultrathin copper foil comprising a supportive copper foil, a release layer superposed on the supportive copper foil, and an ultrathin copper layer superposed on the release layer, wherein the thickness of the ultrathin copper layer is 12 μm or less;
the accuracy of the thickness of the ultrathin copper layer measured with a four-point probe method is 10.0% or less, the four point probe method comprising:
measuring the resistivity of the ultrathin copper foil with a four point probe at 280 measurement points spaced 5 mm apart in the width direction of the ultrathin copper foil;
calculating a thickness of the ultrathin copper foil by using the resistivity of the ultrathin copper foil;
peeling away the ultrathin copper foil layer from the supportive copper foil in the ultrathin copper foil;
redetermining the resistivity of the supportive copper foil at the 280 measurement points;
calculating a thickness of the supportive copper foil by using the resistivity of supportive copper foil;
comparing the thickness of the ultrathin copper foil and the thickness of the supportive copper foil at each measurement point, the difference between the thickness of the ultrathin copper foil and the thickness of the supportive copper foil at each measurement point being the thickness of the ultrathin copper layer at each measurement point;
calculating the accuracy of thickness of the ultrathin copper layer by the equation:

Accuracy in thickness (%)=3σ×100/mean wherein σ is the standard deviation and "mean" is the mean deviation of the thickness of the ultrathin copper layer at the measuring points.

3. The ultrathin copper foil according to claim 1, having a surface roughened layer of coarse particles on the surface of the ultrathin copper layer.

4. A method of manufacturing an ultrathin copper foil comprising a supportive copper foil, a release layer superposed on the supportive copper foil, and an ultrathin copper layer superposed on the release layer according to claim 1 by treating the surface of the supportive copper foil conveyed in a length direction with a roll-to-roll conveying system, comprising:
a step of forming the release layer on the surface of the supportive copper foil conveyed by a conveying roller;
a step of forming an ultrathin copper layer on the surface of the release layer by electrolytic plating while supporting with a drum the supportive copper foil on which the release layer is formed and which is conveyed by a conveying roller; and
a step of determining the accuracy of the thickness of the ultrathin copper layer by the weight method comprising:
punching out from the ultrathin copper foil sixty 3 cm×3 cm samples, which samples are obtained by punching the ultrathin copper foil in a pattern determined by 6 rows of 10 equally spaced punch locations where the rows extend in the width direction of the ultrathin copper foil and adjacent rows are separated by a distance of 4 cm,
for each of the sixty samples:
measuring the total weight of the ultrathin copper layer and the supportive copper foil layer in the sample;

peeling away the ultrathin copper layer from the supportive copper foil layer in the sample;
weighing the supportive copper foil layer thus separated from the ultrathin copper layer in the sample, and determining the weight of the ultrathin copper layer in the sample by subtracting the weight of the supportive copper foil layer from the total weight of the ultrathin copper layer and the supportive copper foil layer;
calculating the accuracy of thickness of the ultrathin copper layer by the equation:

Accuracy in thickness (%)=3σ×100/mean wherein σ is the standard deviation and "mean" is the mean deviation of the weights of the ultrathin copper layer in the samples.

5. The manufacture method of an ultrathin copper foil according to claim 4, wherein the step of forming the release layer is performed by forming the release layer on the surface of the supportive copper foil while supporting with a drum the supportive copper foil conveyed by a conveying roller.

6. The manufacture method of the ultrathin copper foil according to claim 4 or 5, further comprising a step of forming a surface roughened layer of coarse particles on the surface of the ultrathin copper layer of the supportive copper foil conveyed by a conveying roller.

7. The manufacture method of the ultrathin copper foil according to claim 4, further comprising a step of forming a surface roughened layer of coarse particles on the surface of the ultrathin copper layer by electrolytic plating while supporting with a drum the supportive copper foil conveyed by a conveying roller.

8. An ultrathin copper layer comprising an electrolytic copper foil superposed on a release layer superposed on a supportive copper foil and constituting, together with the supportive copper foil and the release layer, an ultrathin copper foil, wherein the thickness of the ultrathin copper layer is 12 μm or less;
the accuracy of the thickness of the ultrathin copper layer is 3.0% or less, determined by a weight method comprising:
punching out from the ultrathin copper foil sixty 3 cm×3 cm samples, which samples are obtained by punching the ultrathin copper foil in a pattern determined by 6 rows of 10 equally spaced punch locations where the rows extend in the width direction of the ultrathin copper foil and adjacent rows are separated by a distance of 4 cm,
for each of the sixty samples:
measuring the total weight of the ultrathin copper layer and the supportive copper foil layer in the sample;
peeling away the ultrathin copper layer from the supportive copper foil layer in the sample;
weighing the supportive copper foil layer thus separated from the ultrathin copper layer in the sample, and determining the weight of the ultrathin copper layer in the sample by subtracting the weight of the supportive copper foil layer from the total weight of the ultrathin copper layer and the supportive copper foil layer;
calculating the accuracy of thickness of the ultrathin copper layer by the equation:

Accuracy in thickness (%)=3σ×100/mean wherein σ is the standard deviation and "mean" is the mean deviation of the weights of the ultrathin copper layer in the samples.

9. An ultrathin copper layer comprising an electrolytic copper foil superposed on a release layer superposed on a supportive copper foil, said ultrathin layer constituting, together with the supportive copper foil and the release layer, an ultrathin copper foil, wherein
the thickness of the ultrathin copper layer is 12 μm or less;
the accuracy of the thickness of the ultrathin copper layer measured with a four-point probe method is 10.0% or less, the four point probe method comprising:
measuring the resistivity of the ultrathin copper foil with a four point probe at 280 measurement points spaced 5 mm apart in the width direction of the ultrathin copper foil;
calculating a thickness of the ultrathin copper foil by using the resistivity of the ultrathin copper foil;
peeling away the ultrathin copper foil layer from the supportive copper foil in the ultrathin copper foil;
redetermining the resistivity of the supportive copper foil at the 280 measurement points;
calculating a thickness of the supportive copper foil by using the resistivity of supportive copper foil;
comparing the thickness of the ultrathin copper foil and the thickness of the supportive copper foil at each measurement point, the difference between the thickness of the ultrathin copper foil and the thickness of the supportive copper foil at each measurement point being the thickness of the ultrathin copper layer at each measurement point;
calculating the accuracy of thickness of the ultrathin copper layer by the equation:

Accuracy in thickness (%)=3σ×100/mean wherein σ is the standard deviation and "mean" is the mean deviation of the thickness of the ultrathin copper layer at the measuring points.

10. The ultrathin copper layer comprising the electrolytic copper foil according to claim 8,
having a surface roughened layer of coarse particles on the surface of the ultrathin copper layer.

11. A printed circuit board comprising the ultrathin copper foil according to claim 1 or 2.

12. A printed circuit board comprising the ultrathin copper layer according claim 8 or 9.

13. An ultrathin copper foil comprising a supportive copper foil, a release layer superposed on the supportive copper foil, and an ultrathin copper layer superposed on the release layer, wherein
the thickness of the ultrathin copper layer is 12 μm or less;
the accuracy of the thickness of the ultrathin copper layer is 2.0% or less, determined by a weight method comprising:
punching out from the ultrathin copper foil sixty 3 cm×3 cm samples, which samples are obtained by punching the ultrathin copper foil in a pattern determined by 6 rows of 10 equally spaced punch locations where the rows extend in the width direction of the ultrathin copper foil and adjacent rows are separated by a distance of 4 cm,
for each of the sixty samples:
measuring the total weight of the ultrathin copper layer and the supportive copper foil layer in the sample;
peeling away the ultrathin copper layer from the supportive copper foil layer in the sample;
weighing the supportive copper foil layer thus separated from the ultrathin copper layer in the sample, and determining the weight of the ultrathin copper layer in the sample by subtracting the weight of the supportive copper foil layer from the total weight of the ultrathin copper layer and the supportive copper foil layer;
calculating the accuracy of thickness of the ultrathin copper layer by the equation:

Accuracy in thickness (%)=3σ×100/mean wherein σ is the standard deviation and "mean" is the mean deviation of the weights of the ultrathin copper layer in the samples.

14. An ultrathin copper foil comprising a supportive copper foil, a release layer superposed on the supportive copper foil, and an ultrathin copper layer superposed on the release layer, wherein
the thickness of the ultrathin copper layer is 12 μm or less;
the accuracy of the thickness of the ultrathin copper layer measured with a four-point probe method is 6.0% or less, the four point probe method comprising:
measuring the resistivity of the ultrathin copper foil with a four point probe at 280 measurement points spaced 5 mm apart in the width direction of the ultrathin copper foil;
calculating a thickness of the ultrathin copper foil by using the resistivity of the ultrathin copper foil;
peeling away the ultrathin copper foil layer from the supportive copper foil in the ultrathin copper foil;
redetermining the resistivity of the supportive copper foil at the 280 measurement points;
calculating a thickness of the supportive copper foil by using the resistivity of supportive copper foil;
comparing the thickness of the ultrathin copper foil and the thickness of the supportive copper foil at each measurement point, the difference between the thickness of the ultrathin copper foil and the thickness of the supportive copper foil at each measurement point being the thickness of the ultrathin copper layer at each measurement point;
calculating the accuracy of thickness of the ultrathin copper layer by the equation:

Accuracy in thickness (%)=3σ×100/mean wherein σ is the standard deviation and "mean" is the mean deviation of the thickness of the ultrathin copper layer at the measuring points.

15. The ultrathin copper foil according to claim 2, having a surface roughened layer of coarse particles on the surface of the ultrathin copper layer.

16. The ultrathin copper foil according to claim 13, having a surface roughened layer of coarse particles on the surface of the ultrathin copper layer.

17. The ultrathin copper foil according to claim 14, having a surface roughened layer of coarse particles on the surface of the ultrathin copper layer.

18. An ultrathin copper layer comprising an electrolytic copper foil superposed on a release layer superposed on a supportive copper foil and constituting, together with the supportive copper foil and the release layer, an ultrathin copper foil, wherein
the thickness of the ultrathin copper layer is 12 μm or less;
the accuracy of the thickness of the ultrathin copper layer is 2.0% or less, determined by a weight method comprising:
punching out from the ultrathin copper foil sixty 3 cm×3 cm samples, which samples are obtained by punching the ultrathin copper foil in a pattern determined by 6 rows of 10 equally spaced punch locations where the rows extend in the width direction of the ultrathin copper foil and adjacent rows are separated by a distance of 4 cm, for each of the sixty samples:
measuring the total weight of the ultrathin copper layer and the supportive copper foil layer in the sample;
peeling away the ultrathin copper layer from the supportive copper foil layer in the sample;
weighing the supportive copper foil layer thus separated from the ultrathin copper layer in the sample, and determining the weight of the ultrathin copper layer in the sample by subtracting the weight of the supportive copper foil layer from the total weight of the ultrathin copper layer and the supportive copper foil layer;
calculating the accuracy of thickness of the ultrathin copper layer by the equation:

Accuracy in thickness (%)=3σ×100/mean wherein σ is the standard deviation and "mean" is the mean deviation of the weights of the ultrathin copper layer in the samples.

19. An ultrathin copper layer comprising an electrolytic copper foil superposed on a release layer superposed on a supportive copper foil and constituting, together with the supportive copper foil and the release layer, an ultrathin copper foil, wherein
the thickness of the ultrathin copper layer is 12 μm or less;
the accuracy of the thickness of the ultrathin copper layer measured with a four-point probe method is 6.0% or less, the four point probe method comprising:
measuring the resistivity of the ultrathin copper foil with a four point probe at 280 measurement points spaced 5 mm apart in the width direction of the ultrathin copper foil;
calculating a thickness of the ultrathin copper foil by using the resistivity of the ultrathin copper foil;
peeling away the ultrathin copper foil layer from the supportive copper foil in the ultrathin copper foil;
redetermining the resistivity of the supportive copper foil at the 280 measurement points;
calculating a thickness of the supportive copper foil by using the resistivity of supportive copper foil;
comparing the thickness of the ultrathin copper foil and the thickness of the supportive copper foil at each measurement point, the difference between the thickness of the ultrathin copper foil and the thickness of the supportive copper foil at each measurement point being the thickness of the ultrathin copper layer at each measurement point;
calculating the accuracy of thickness of the ultrathin copper layer by the equation:

Accuracy in thickness (%)=3σ×100/mean wherein σ is the standard deviation and "mean" is the mean deviation of the thickness of the ultrathin copper layer at the measuring points.

20. The ultrathin copper layer comprising the electrolytic copper foil according to claim 18,
having a surface roughened layer of coarse particles on the surface of the ultrathin copper layer.

21. The ultrathin copper layer according to claim 9,
having a surface roughened layer of coarse particles on the surface of the ultrathin copper layer.

22. The ultrathin copper layer comprising the electrolytic copper foil according to claim 19,
having a surface roughened layer of coarse particles on the surface of the ultrathin copper layer.

23. A printed circuit board comprising the ultrathin copper foil according to claim 3 or 16.

24. A printed circuit board comprising the ultrathin copper layer according to claim 10 or 21.

* * * * *